(12) United States Patent
Wang et al.

(10) Patent No.: US 11,906,830 B2
(45) Date of Patent: *Feb. 20, 2024

(54) DISPLAY DEVICE

(71) Applicant: Samsung Display Co., Ltd., Yongin-si (KR)

(72) Inventors: Seong Min Wang, Seongnam-si (KR); Beohm Rock Choi, Seoul (KR); Yong Ho Yang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/980,579

(22) Filed: Nov. 4, 2022

(65) Prior Publication Data

US 2023/0056635 A1 Feb. 23, 2023

Related U.S. Application Data

(63) Continuation of application No. 17/167,004, filed on Feb. 3, 2021, now Pat. No. 11,493,795, which is a
(Continued)

(30) Foreign Application Priority Data

Mar. 30, 2018 (KR) .................. 10-2018-0037659

(51) Int. Cl.
*G09G 5/00* (2006.01)
*G02F 1/1333* (2006.01)
(Continued)

(52) U.S. Cl.
CPC ........ *G02F 1/1333* (2013.01); *G02F 1/13338* (2013.01); *G06V 40/13* (2022.01);
(Continued)

(58) Field of Classification Search
CPC .............. G02F 1/1333; G02F 1/13338; G02F 2201/086; G02F 2201/58; G02F 2202/28;
(Continued)

(56) References Cited

U.S. PATENT DOCUMENTS

| 8,350,275 B2 | 1/2013 | Yan et al. |
| 9,551,783 B2 | 1/2017 | Schneider et al. |

(Continued)

FOREIGN PATENT DOCUMENTS

| CN | 101529285 | 9/2009 |
| CN | 202595022 | 12/2012 |

(Continued)

OTHER PUBLICATIONS

Partial European Search Report dated Jul. 17, 2019 issued in European Patent Application No. 19157619.8.
(Continued)

*Primary Examiner* — Insa Sadio
(74) *Attorney, Agent, or Firm* — H.C. Park & Associates, PLC

(57) ABSTRACT

A display device including a display panel having a first side including a display area configured to emit light and a second side opposite to the first side, a sensor having a first surface facing the display panel, a first adhesive layer disposed between the first surface of the sensor and the display panel, and a second adhesive layer disposed on a side surface of the sensor, in which the second adhesive layer and the first adhesive layer contact each other.

22 Claims, 9 Drawing Sheets

Related U.S. Application Data continuation of application No. 16/203,614, filed on Nov. 29, 2018, now Pat. No. 10,942,385.

(51) Int. Cl.
| | |
|---|---|
| *H10K 50/86* | (2023.01) |
| *H10K 50/842* | (2023.01) |
| *H10K 59/60* | (2023.01) |
| *G06V 40/13* | (2022.01) |
| *G06V 40/12* | (2022.01) |

(52) U.S. Cl.
CPC ....... *H10K 50/8426* (2023.02); *H10K 50/865* (2023.02); *H10K 59/60* (2023.02); *G02F 2201/086* (2013.01); *G02F 2201/58* (2013.01); *G02F 2202/28* (2013.01); *G06V 40/12* (2022.01); *G06V 40/1306* (2022.01); *G06V 40/1318* (2022.01)

(58) Field of Classification Search
CPC .... G06V 40/12; G06V 40/13; G06V 40/1306; G06V 40/1318; H10K 50/8426; H10K 50/865; H10K 59/60
See application file for complete search history.

(56) References Cited

U.S. PATENT DOCUMENTS

| | | | |
|---|---|---|---|
| 9,640,681 B2 | 5/2017 | Min | |
| 9,897,834 B2 | 2/2018 | Kubota et al. | |
| 10,133,111 B2 | 11/2018 | Lee | |
| 10,175,512 B2 | 1/2019 | Kubota et al. | |
| 10,175,513 B2 | 1/2019 | Kubota et al. | |
| 10,276,828 B2 | 4/2019 | Kwon et al. | |
| 10,295,851 B2 | 5/2019 | Kubota et al. | |
| 10,366,272 B2 | 7/2019 | Song et al. | |
| 2010/0020396 A1 | 1/2010 | Izumi et al. | |
| 2015/0070599 A1* | 3/2015 | Tomooka | B32B 27/08 349/12 |
| 2016/0116777 A1 | 4/2016 | Kubota et al. | |
| 2017/0090632 A1 | 3/2017 | Su et al. | |
| 2017/0168621 A1 | 6/2017 | Jo et al. | |
| 2017/0187934 A1 | 6/2017 | Kwak et al. | |
| 2017/0287992 A1 | 10/2017 | Kwak et al. | |
| 2017/0300736 A1* | 10/2017 | Song | G06V 40/1312 |
| 2017/0344788 A1* | 11/2017 | Lee | G06V 10/147 |
| 2017/0372115 A1 | 12/2017 | Lee et al. | |
| 2018/0068159 A1 | 3/2018 | Benkley, III et al. | |

FOREIGN PATENT DOCUMENTS

| | | |
|---|---|---|
| CN | 103065549 | 4/2013 |
| CN | 103424957 | 12/2013 |
| CN | 106876601 | 6/2017 |
| CN | 107305411 | 10/2017 |
| JP | 2010176111 A1 | 8/2010 |
| JP | 2014164087 | 9/2014 |
| JP | 2016166109 | 9/2016 |
| JP | 2018037081 | 3/2018 |
| KR | 10-2016-0014712 | 2/2016 |
| KR | 20160024061 | 3/2016 |
| KR | 10-2017-0037503 | 4/2017 |
| KR | 10-2017-0077360 | 7/2017 |
| KR | 10-2017-0111827 | 10/2017 |
| KR | 10-2017-0136972 | 12/2017 |
| TW | 201641274 | 12/2016 |
| WO | 2017037850 A1 | 3/2017 |

OTHER PUBLICATIONS

Non-Final Office Action dated Mar. 5, 2020, issued to U.S. Appl. No. 16/203,614.
Final Office Action dated Aug. 5, 2020, issued to U.S. Appl. No. 16/203,614.
Notice of Allowance dated Nov. 13, 2020, issued to U.S. Appl. No. 16/203,614.
Office Action dated Apr. 26, 2022 from the Japanese Patent Office for Japanese Patent Application No. 2018-207173.
Office Action dated Jun. 16, 2022 from the Korean Patent Office for Korean Patent Application No. 10-2018-0037659.
Office Action dated Aug. 30, 2022 from the Taiwanese Patent Office for Taiwanese Patent Application No. 108107662 (with English Concise Explanation).
Non-Final Office Action dated Mar. 15, 2022, issued to U.S. Appl. No. 17/167,004.
Notice of Allowance dated Jul. 7, 2022, issued to U.S. Appl. No. 17/167,004.
Notice of Allowance dated Aug. 2, 2022, issued to U.S. Appl. No. 17/167,004.
Notice of Allowance dated Sep. 28, 2022, issued to U.S. Appl. No. 17/167,004.
Office Action dated Dec. 6, 2022 from the Japanese Patent Office for Japanese Patent Application No. 2018- 207173 (with English Translation).
Office Action dated Aug. 11, 2023, for corresponding Chinese Application No. 201910166665.2 (with English Concise Explanation).

* cited by examiner

DISPLAY DEVICE

CROSS-REFERENCE TO RELATED APPLICATIONS

This application is a continuation of U.S. patent application Ser. No. 17/167,004, filed on Feb. 3, 2021, which is a continuation of U.S. patent application Ser. No. 16/203,614, filed on Nov. 29, 2018, now issued as U.S. Pat. No. 10,942,385, which claims priority from and the benefit of Korean Patent Application No. 10-2018-0037659, filed on Mar. 30, 2018, each of which is hereby incorporated by reference for all purposes as if fully set forth herein.

BACKGROUND

Field

Exemplary embodiments of the invention relate generally to a display device, and, more particularly, to a display device including a sensor disposed underneath a display area of the display panel.

Discussion of the Background

As information technology develops, the market of a medium for providing information to a user, such as a display device, is increasing. This type of display device has developed in various forms, and an organic light emitting diode display or a liquid crystal display generally used as due to their excellent characteristics, such as thin platform, light weight, and low power consumption.

As outdoor usage of information appliances increases, the amount of time such a display device is exposed to sunlight has been increasing. In addition, various manufacturing processes required to produce a display device require irradiation of ultraviolet rays. As such, when ultraviolet rays of the external light freely penetrate to inside of the display device, a light emitting layer including an organic material, an insulating layer, or a thin film transistor of the display device may be seriously damaged.

The above information disclosed in this Background section is only for understanding of the background of the inventive concepts, and, therefore, it may contain information that does not constitute prior art.

SUMMARY

Applicants have discovered that irradiating ultraviolet rays of an adhesive layer to attach a sensor to a display panel deteriorates the reliability of a display panel.

Display devices constructed according to the principles of the invention include a sensor attached to a display area, and are capable of preventing adverse effects due to irradiation during manufacture, including the occurrence of a stain when attaching the sensor in the display area of the display panel.

Additional features of the inventive concepts will be set forth in the description which follows, and in part will be apparent from the description, or may be learned by practice of the inventive concepts.

A display device according to an exemplary embodiment includes a display panel having a first side including a display area configured to emit light and a second side opposite the first side, an auxiliary layer disposed on the second side of the display area and including an opening, a sensor overlapping the opening, and an adhesive layer connected between the sensor and the auxiliary layer.

The adhesive layer may not overlap the opening.

The sensor may overlap a portion of the auxiliary layer and the entire opening.

The auxiliary layer may include an ultraviolet absorber.

The ultraviolet absorber may include a hydroxyl group.

The ultraviolet absorber may include at least one of a benzophenone-based compound, a benzotriazole-based compound, a benzoate-based compound, a cyanoacrylate-based compound, a triazine-based compound, an oxanilide-based compound, and a salicylate-based compound.

The sensor may have a first surface facing the display panel and a second surface angularly disposed to the first surface, the auxiliary layer may have a first surface facing the first surface of the sensor, and the adhesive layer may include a first adhesive layer disposed between the first surface of the sensor and the first surface of the auxiliary layer, and a second adhesive layer contacting the second surface of the sensor and the first surface of the auxiliary layer.

The first adhesive layer may be a tape.

The first adhesive layer and the second adhesive layer may include substantially the same material.

The sensor may include at least one of a fingerprint recognition sensor and an infrared ray detection sensor.

The display device may further include a screen print layer disposed on the display panel.

A display device according to another exemplary embodiment includes a display device including a display panel having a display area, an auxiliary layer disposed on the display area and including an opening, a sensor overlapping the opening, and an ultraviolet (UV) absorbing film configured to block UV radiation from being irradiated into the display panel.

The display device may further include an adhesive layer disposed between a first surface of the ultraviolet absorbing film and the sensor.

The display panel may be flexible.

The display may further include a passivation film disposed between the display panel and the ultraviolet absorbing film, and an adhesive layer disposed between the passivation film and the display panel.

The adhesive layer may include a conductive polymer.

The ultraviolet absorbing film may include a hydroxyl group.

The ultraviolet absorbing film may include at least one of a benzophenone-based compound, a benzotriazole-based compound, a benzoate-based compound, a cyanoacrylate-based compound, a triazine-based compound, an oxanilide-based compound, and a salicylate-based compound.

The sensor may entirely overlap the opening.

A display device according to still another exemplary embodiment includes a display panel having a display area with a first surface extending in a first direction, an auxiliary layer having a first surface disposed on the display area and extending in a direction intersecting the first direction, the auxiliary layer including an opening, a sensor overlapping the opening and having a first surface extending a direction intersecting the first direction, and a tape disposed between the first and second lateral surfaces to connect sensor to the auxiliary layer.

The display device may further include a passivation film disposed between the auxiliary layer and the display panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
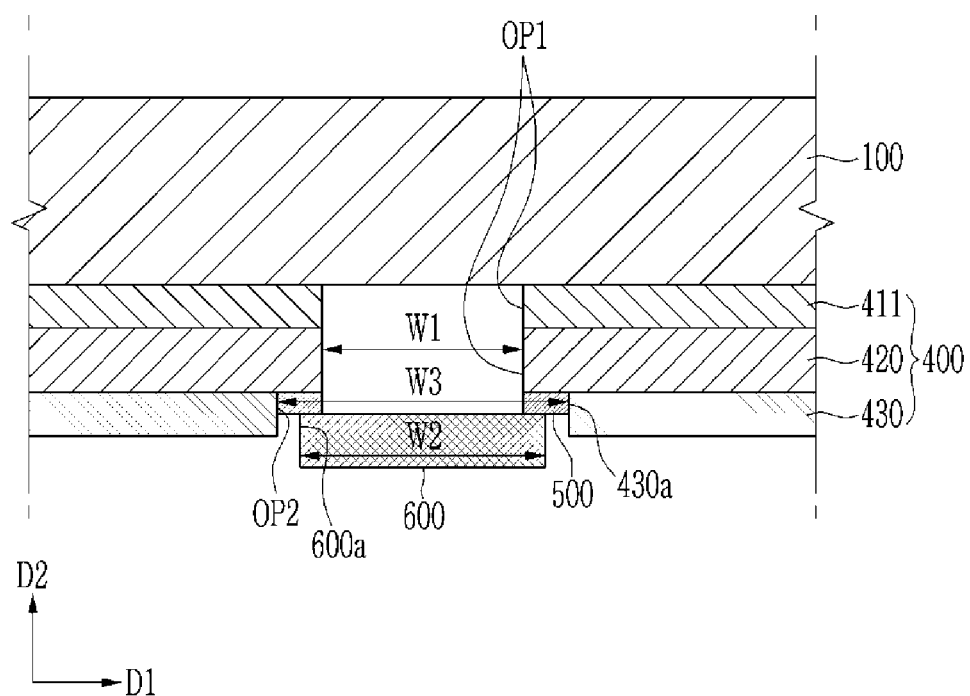
FIG. 1 is a schematic cross-sectional view of an exemplary embodiment a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an exemplary embodiment will be described with reference to FIG. 1. FIG. 1 is a schematic cross-sectional view of a display device according to an exemplary embodiment.

Referring to FIG. 1, a display device according to an exemplary embodiment includes a display panel 100 emitting light, a passivation layer 400 disposed on a back surface of the display panel 100, and a sensor 600.

FIG. 1 illustrates that the display panel 100 is flat, but the inventive concepts are not limited thereto, and the display panel 100 may be flexible, stretchable, foldable, bendable, or rollable.

The display panel 100 may be an organic light emitting panel or a liquid crystal panel. The display panel 100 may include a substrate, a plurality of thin film transistors disposed on the substrate, and a plurality of electrodes.

Hereinafter, the display panel 100 will be described as an organic light emitting panel or a liquid crystal panel, but the inventive concepts are not limited thereto. For example, a display panel 100 according to another exemplary embodiment may be an electrophoretic display panel, an electrowetting display panel, or the like.

The display panel 100 may emit light in D2 direction, but the inventive concepts are not limited thereto.

The passivation layer 400 may include a screen print layer 411, a first auxiliary layer 420, and a second auxiliary layer 430. In some exemplary embodiments, one or more of the screen print layer 411, the first auxiliary layer 420, and the second auxiliary layer 430 may be omitted.

The screen print layer 411 may contact the back surface of the display panel 100. The screen print layer 411 may prevent a substrate (for example, a glass substrate) included in the display panel 100 from being scratched or the like. In some exemplary embodiments, the screen print layer 411 may be omitted.

The screen print layer 411 may include, for example, a polyester-based compound and an antistatic agent. The screen print layer 411 may protect the display panel 100 from static electricity through an antistatic agent thereof. In addition, the screen print layer 411 may further include a binder, a filler, a hardener, an additive, and the like.

The first auxiliary layer 420 and the second auxiliary layer 430 may overlap the display panel 100. More particularly, the first auxiliary layer 420 and the second auxiliary layer 430 may overlap a display area of the display panel 100 at the back side of the display panel. The first auxiliary layer 420 and the second auxiliary layer 430 may protect the display panel 100 from external impact. Although the first auxiliary layer 420 and the second auxiliary layer 430 are described as separate layers, the inventive concepts are not limited thereto. For example, according to an exemplary embodiment, one of the first auxiliary layer 420 and the second auxiliary layer 430 may be omitted, or the first auxiliary layer 420 and the second auxiliary layer 430 may be formed as a single layer.

The first auxiliary layer 420 and the second auxiliary layer 430 may include a polymer resin or metal, such as aluminum or steel use stainless (SUS). For example, the first auxiliary layer 420 may include a polymer resin and the second auxiliary layer 430 may include metal.

The polymer resin includes at least one of polyurethane, polycarbonate, polypropylene, polyethylene, and polyethyleneterephthalate, or may be a rubber liquid, a urethane-based material, or a sponge foamed with an acrylic material, but the inventive concepts are not limited thereto. Densities of the first auxiliary layer 420 and the second auxiliary layer 430 may controlled according to foaming molding conditions of materials included therein.

The first auxiliary layer 420 according to an exemplary embodiment may include an ultraviolet absorber. The ultraviolet absorber may absorb ultraviolet rays having a wavelength of about 200 nm to about 400 nm.

The ultraviolet absorber may include at least one of a benzophenone-based compound, a benzotriazole-based compound, a benzoate-based compound, a cyanoacrylate-based compound, a triazine-based compound, an oxanilide-based compound, and a salicyate-based compound.

The benzophenone-based compound may include at least one of 2,4-dihydroxybenzophenone, 2-hydroxy-4-methoxybenzophenone, 2-hydroxy-4-octylbenzophenone, 4-dodecyloxy-2-hydroxybenzophenone, 4-benzyloxy-2-hydroxybenzophenone, 2,2'',4,4''-tetrahydroxybenzophenone, and 2,2''-dihydroxy 4,4''-dimethoxybenzo, but the inventive concepts are not limited thereto.

The benzotriazole-based compound may include at least one of 2-(5-methyl-2-hydroxyphenyl) benzotriazole, 2-[2-hydroxy-3,5-bisα,αα-dimethylbenzyl) phenyl]-2H-benzotriazole, 2-(3,5-di-t-butyl-2-hydroxyphenyl) benzotriazole, 2-(3-t-butyl-5-methyl-2-hydroxyphenyl)-5-chlorobenzotriazole, 2-(3-t-butyl-5-methyl-2-hydroxyphenyl)-5-chlorobenzotriazole, 2-(3,5-di-t-butyl-2-hydroxyphenyl)-5-chlorobenzotriazole, 2-(3,5-di-t-acyl-2-hydroxyphenyl) benzotriazole, and 2-(2''-hydroxy 5''-t-octylphenyl) benzotriazole, but the inventive concepts are not limited thereto.

The benzoate-based compound may include, 2,4-di-t-butylphenyl-3'',5''-di-t-butyl-4-hydroxybenzoate, and the like, but the inventive concepts are not limited thereto.

The triazine-based compound may include 2-[4-[(2-hydroxy-3-dodecyloxypropyl) oxy]-2-hydroxyphenyl]-4,6-bis (2,4-dimethylphenyl) 1,3,5-triazine, but the inventive concepts are not limited thereto.

The salicylate-based compound may include at least one of phenyl salicylate and 4-t-butylphenyl salicylate, but the inventive concepts are not limited thereto.

Chemical formulae of the benzophenone-based compound and the benzotriazole-based compound among the ultraviolet absorbers according to an exemplary embodiment are as the following.

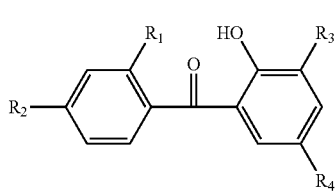

<Chemical Formula 1>

In Chemical Formula 1, $R_1$ may be one of hydrogen (H), an alkyl group, and a hydroxyl group, $R_2$ may be one of hydrogen (H), an alkyl group, and a phenyl group, $R_3$ may be one of hydrogen (H) and an alkyl group, and $R_4$ may be one of hydrogen (H) and an alkoxy group.

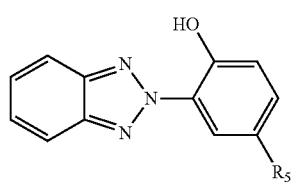

<Chemical Formula 2>

In Chemical Formula 2, $R_5$ may be one of hydrogen (H) and an alkyl group.

As shown in Chemical Formulae 1 and 2, the benzophenone-based compound and the benzotriazole-based compound include a hydroxyl group (—OH). However, the inventive concepts are not limited to the benzophenone-based compound and the benzotriazole-based compound, and the ultraviolet absorber may include a hydroxyl group. The ultraviolet absorber may include a monomolecular material having a hydroxyl group (—OH), which is a functional group capable of hydrogen bonding, thereby absorbing ultraviolet rays incident from the outside by an excited-state intramolecular proton transfer (ESIPT).

Specifically, in the ultraviolet absorbers, atoms that have a non-covalent electron pair, such as an oxygen (O) atom or a nitrogen (N) atom, may be present to be adjacent to the hydroxyl group (—OH) in a molecule thereof, and a hydrogen bond may be formed between the hydroxyl group (—OH) and the atoms having the non-covalent electron pair. In this case, the ultraviolet absorbers that absorb ultraviolet rays to be in an excited state undergo phototautomerization, whereby protons move into excited molecules. Thus, hydrogen (H) is released from the hydroxyl group (—OH) and becomes stable molecules having a keto form, whereby heat is released. As such, the ultraviolet rays incident on the ultraviolet absorbers are converted into heat energy and are released to the outside, thereby blocking ultraviolet rays from entering into the display panel 100.

The sensor 600 may include at least one of a sensor to sense the user's biometric information, such as a fingerprint or iris, and an infrared sensing sensor. In addition, the sensor 600 may be an optical sensor and an ultrasonic sensor.

The sensor 600 may overlap a first opening OP1 provided in the screen print layer 411 and/or the first auxiliary layer 420. The first the opening OP1 may overlap a display area of the display panel 100.

A width W2 of the sensor 600 in the first direction D1 may be greater than a width W1 of the first opening OP1 in the first direction D1. The sensor 600 may entirely overlap the first opening OP1 in a plan view, and may partially overlap the first auxiliary layer 420. An area of one surface of the sensor 600 parallel to a back surface of the display panel 100 may be greater than that of the opening OP.

The width W2 of the sensor 600 in the first direction D1 may be less than a width W3 of a second opening OP2 in the first direction D1 provided in the second auxiliary layer 430. The sensor 600 may be inserted into the second opening OP2 of the second auxiliary layer 430.

An adhesive layer 500 is disposed between the sensor 600 and the first auxiliary layer 420. The adhesive layer 500 may attach the sensor 600 to the first auxiliary layer 420, such that the sensor 600 is attached to the display panel 100. In addition, the adhesive layer 500 may contact a lateral surface 430a of the second auxiliary layer 430. The adhesive layer 500 may be disposed in the second opening OP2 without completely overlapping with the sensor 600. Light irradiated toward the display device in a photo-curing process may be directly incident on the adhesive layer 500 where it extends outwardly from and does not overlap the sensor 600.

The sensor 600 and the first auxiliary layer 420 may be sufficiently attached to each other by positioning the adhesive layer 500 in a region where the sensor 600 and the first auxiliary layer 420 partially overlap each other. The adhesive layer 500 may attach the first auxiliary layer 420 to one surface 600a of the sensor 600 facing the display panel 100.

FIG. 1 illustrates that the adhesive layer 500 has a substantially flat shape, and the sensor 600 is attached to the adhesive layer 500. However, the inventive concepts are not limited thereto, the adhesive layer 500 may have various thicknesses and/or shapes. For example, the thickness of the adhesive layer 500 positioned in a region where the sensor 600 and the adhesive layer 500 overlap each other may be less than that of the adhesive layer 500 positioned in a region where the sensor 600 and the adhesive layer 500 do not overlap each other.

The adhesive layer 500 may be partially pressed in the process of attaching the sensor 600 to the adhesive layer 500.

The adhesive layer 500 according to the illustrated exemplary embodiment may include an optical transparent adhesive material. The adhesive layer 500 including the optical transparent adhesive material may include an optical clear adhesive (OCA) or an optical clear resin (OCR). In addition, the adhesive layer 500 may include at least one of an acrylic adhesive, a silicone adhesive, and a urethane adhesive.

For example, the adhesive layer 500 including the OCA may be provided in a form of a double-sided tape. The OCA provided in the form of the double-sided tape may include uncured monomers or oligomers. The uncured monomer or oligomer may be cured through an additional UV curing process after providing the optical transparent adhesive layer.

For example, the adhesive layer 500 including the OCR may be disposed between the first auxiliary layer 420 and the sensor 600 in a form of a liquid adhesive resin. The liquid adhesive resin may be provided between the first auxiliary layer 420 and the sensor 600, and then deformed into a fixed adhesive layer 500 through an additional UV curing process.

The adhesive resin forming the adhesive layer 500 may include an uncured cross-linking reaction group. The adhesive resin may include materials which may be post-cured by ultraviolet rays. For example, the adhesive resin forming the adhesive layer 500 may include an uncured oligomer or monomer. An unreacted cross-linking reaction group may facilitate a crosslinking reaction after the ultraviolet curing process, to increase a degree of crosslinking of the adhesive layer 500. The cross-linking reaction group may be a photocurable reaction group. In addition, the adhesive resin may include an initiator, such as a photoinitiator. The photoinitiator may induce additional polymerization reaction of a monomer or oligomer.

In the process of forming the adhesive layer 500, ultraviolet rays may be irradiated into the adhesive layer 500. However, when the ultraviolet rays are incident on the display area of the display panel 100, physical properties of the thin film transistor or light emitting diode may be changed, which may degrade the reliability of the display device. The display device constructed according to the principles of the invention includes the first auxiliary layer 420, which may absorb substantially all of the ultraviolet rays irradiated to the adhesive layer 500, thereby preventing the ultraviolet rays from being incident on the display area of the display panel 100.

Figure 2:
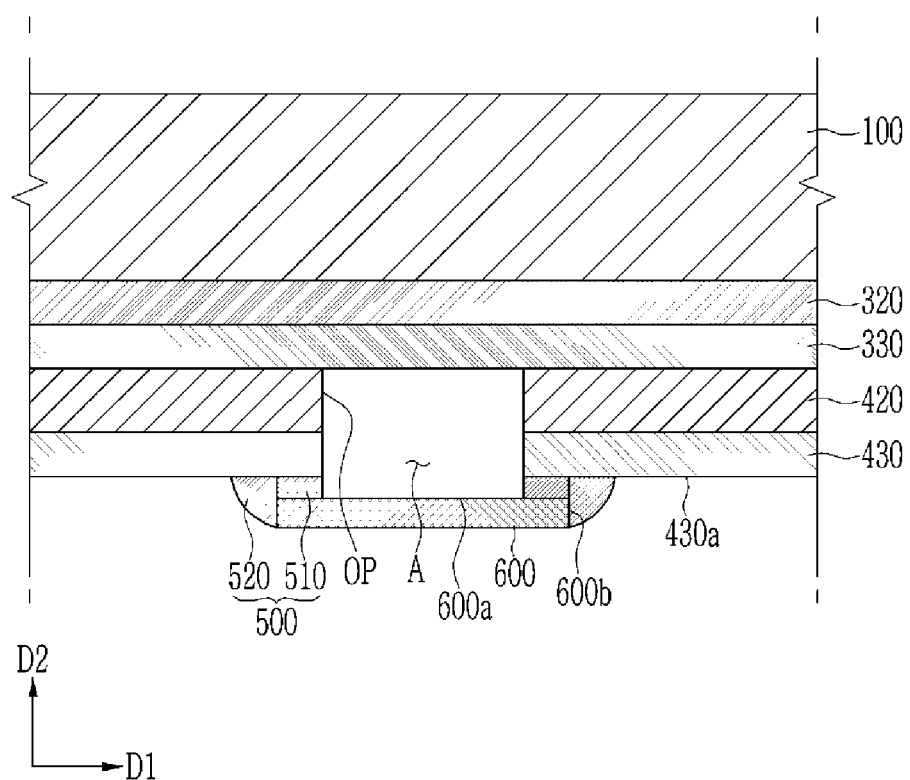
FIG. 2 is a schematic cross-sectional view of a display device according to an exemplary embodiment.
Figure 3:
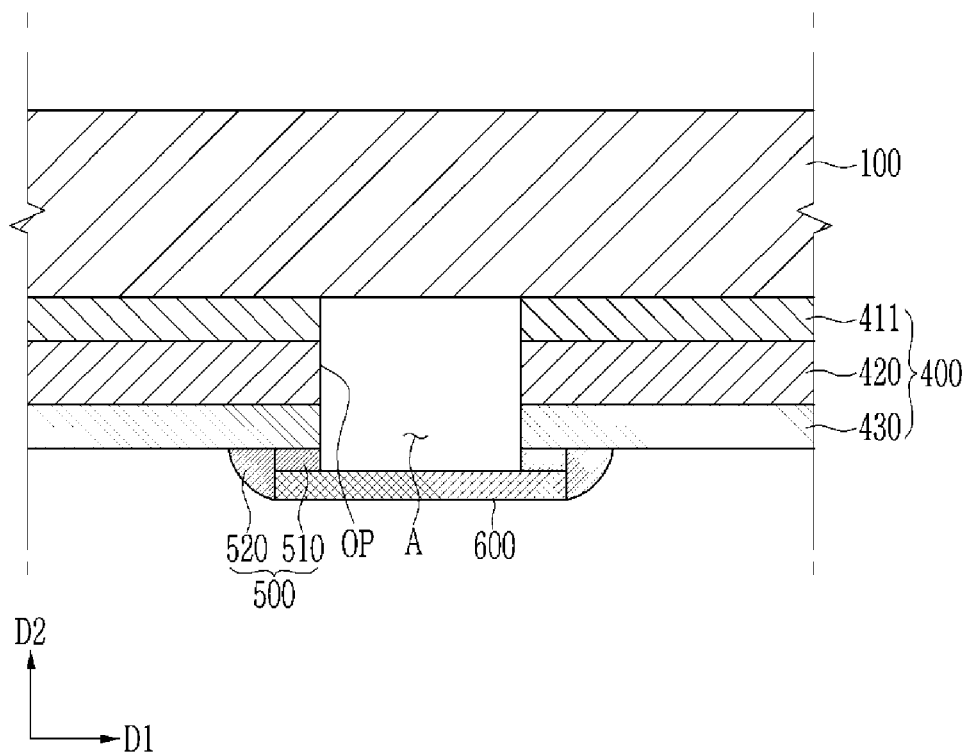
FIG. 3 is a schematic cross-sectional view of a display device according to an exemplary embodiment.

Hereinafter, a display device according to an exemplary embodiment will be described with reference to FIG. 2 and FIG. 3. FIG. 2 and FIG. 3 are schematic cross-sectional views of a display device according to exemplary embodiments. Display devices shown in FIGS. 2 and 3 include elements substantially the same as those in the display device of FIG. 1. As such, repeated descriptions of the substantially the same elements will be omitted to avoid redundancy.

Referring to FIG. 2, the display device according to an exemplary embodiment may include the display panel 100 emitting light in the D2 direction, auxiliary layers 420 and 430 disposed on the back surface of the display panel 100, a bonding layer 320 and a passivation film 330 disposed between the display panel 100 and the auxiliary layers 420 and 430, the sensor 600, and the adhesive layer 500 for attaching the sensor 600 to the auxiliary layers 420 and 430.

The display panel 100 according to an exemplary embodiment may be flexible, stretchable, foldable, bendable, or rollable.

The bonding layer 320 may be disposed between the passivation film 330 and the display panel 100. The bonding layer 320 may include a conductive adhesive material. A sheet resistance of the bonding layer 320 may be in the range of about $10^9$ $\Omega/cm^2$ to about $10^{12}$ $\Omega/cm^2$.

For example, the bonding layer 320 may include at least one of poly(3,4-ethylenedioxythiophene):poly(styrenesulfonate)(PEDOT:PSS), poly(para-phenylenevinylene) (PAC), polyaniline(PANI), polypyrrole, and poly(thiophene), but the inventive concepts are not limited thereto.

The passivation film 330 may be disposed between the bonding layer 320 and the auxiliary layers 420 and 430. The passivation film 330 may be flexible and improve strength of the display panel 100. The passivation film 330 may include a polymer, for example, a polyester (PET), but the inventive concepts are not limited thereto.

The first auxiliary layer 420 and the second auxiliary layer 430 may be provided with an opening OP of the same size. The opening OP may completely overlap the display area of the display panel 100.

The sensor 600 may be attached to the second auxiliary layer 430 by the adhesive layer 500. According to an exemplary embodiment, the second auxiliary layer 430 may be omitted, and the sensor 600 may be attached to the first auxiliary layer 420. There may be a predetermined open space (A) between the sensor 600 and the display panel 100.

The adhesive layer 500 may include a first adhesive layer 510 and a second adhesive layer 520.

The first adhesive layer 510 may contact one surface 600a of the sensor 600 facing the display panel 100. In addition, the first adhesive layer 510 may contact one surface 430a of the second auxiliary layer 430 facing the one surface 600a of the sensor 600.

The first adhesive layer 510 may be a tape. The sensor 600 and the second auxiliary layer 430 may be attached without a separate photo-curing process by including the first adhesive layer 510 provided in the form of a double-sided tape.

The second adhesive layer 520 may attach a lateral surface 600b of the sensor 600 and one surface of the second auxiliary layer 430. The second adhesive layer 520 may contact the first adhesive layer 510, the sensor 600, and the second auxiliary layer 430.

The second adhesive layer 520 may include the same material as the adhesive layer 500 described with reference to FIG. 1. Detailed descriptions of the material forming the adhesive layer 500 will be omitted to avoid redundancy. A photo-curing process may be performed to cure the second adhesive layer 520.

At least one of the first auxiliary layer 420 and the second auxiliary layer 430 may include the ultraviolet absorber already described above. As such, detailed descriptions of the ultraviolet absorber will be omitted to avoid redundancy.

In this manner, even when ultraviolet rays are irradiated toward the display panel 100 to cure the second adhesive layer 520, the display device according to an exemplary embodiment may absorb the ultraviolet rays due to the ultraviolet absorber included in at least one of the first auxiliary layer 420 and the second auxiliary layer 430. As such, it is possible to prevent the ultraviolet rays from being incident on the display panel 100.

Referring to FIG. 3, the display panel 100 according to an exemplary embodiment may be a flat display panel 100. In this case, unlike the display device shown in FIG. 2, it is possible to include the screen print layer 411 without including the bonding layer 320 and the passivation film 330 shown in FIG. 2. Since other constituent elements of FIG. 3 are substantially the same as those of FIG. 2, detailed descriptions thereof will be omitted to avoid redundancy.

Figure 4:
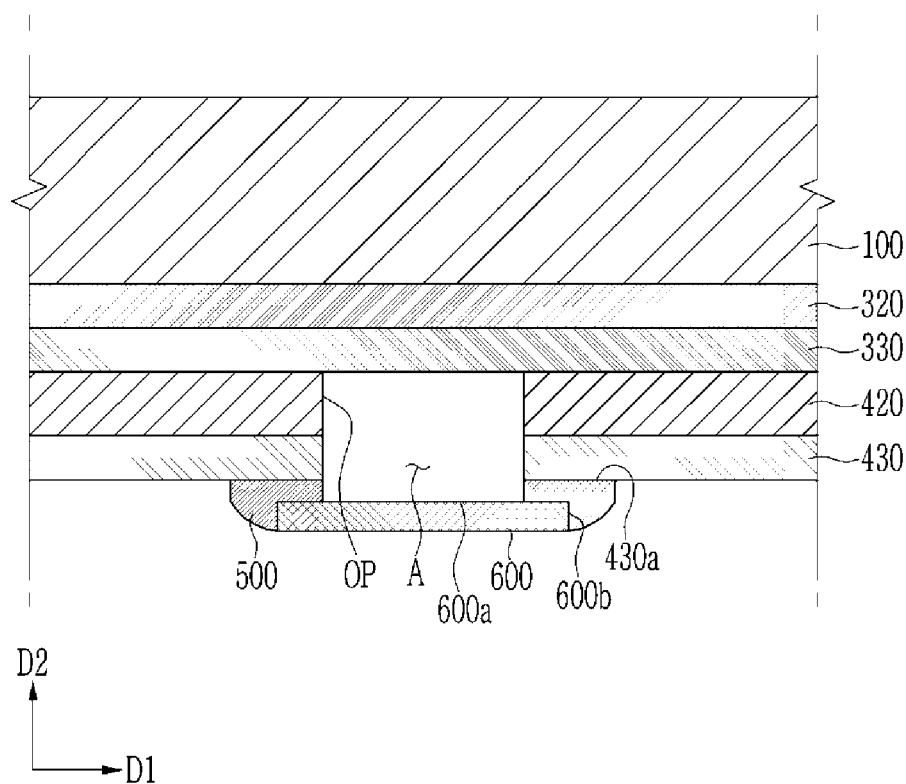
FIG. 4 is a schematic cross-sectional view of a display device according to an exemplary embodiment.
Figure 5:
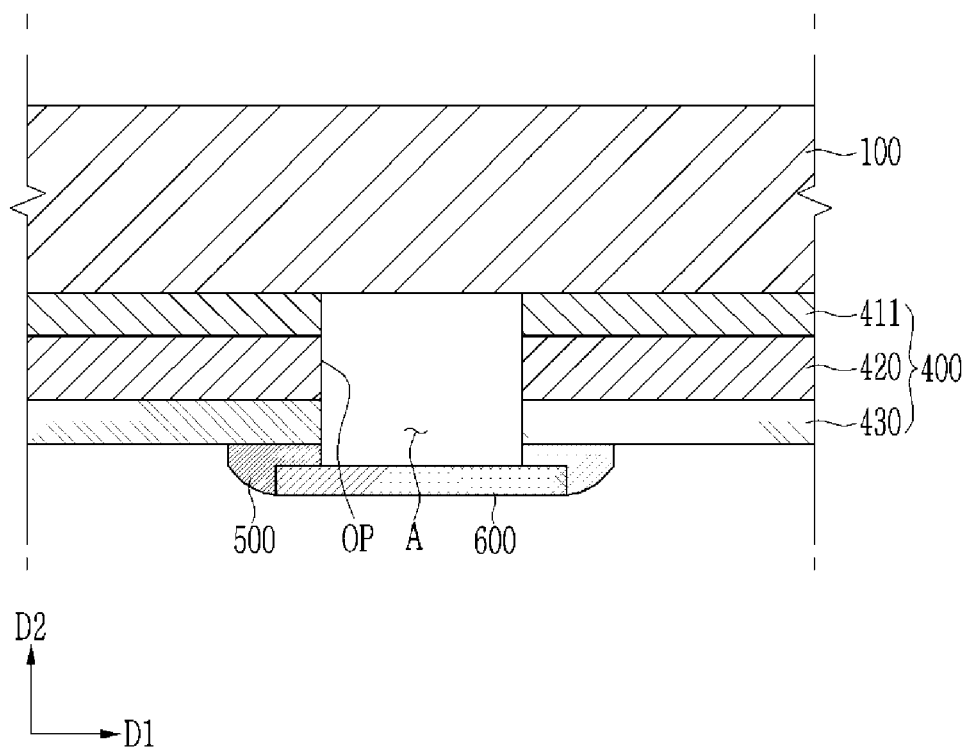
FIG. 5 is a schematic cross-sectional view of a display device according to an exemplary embodiment.

Hereinafter, a display device according to exemplary embodiments will be described with reference to FIG. 4 and FIG. 5. FIG. 4 and FIG. 5 are schematic cross-sectional views of a display device according to exemplary embodiments. Detailed descriptions of constituent elements that are substantially the same as those described above will be omitted to avoid redundancy.

Referring to FIG. 4, the display panel 100 according to an exemplary embodiment may be flexible, stretchable, foldable, bendable, or rollable.

The adhesive layer 500 according to an exemplary embodiment may contact one surface 600a and a lateral surface 600b of the sensor 600 facing the display panel 100. In addition, the adhesive layer 500 may contact one surface 430a of the second auxiliary layer 430 facing the one surface 600a of the sensor 600.

The adhesive layer 500 may include substantially the same material as the first adhesive layer 510 or the second adhesive layer 520 described above with reference to FIG. 2. The adhesive layer 500 may include the first adhesive layer 510 and the second adhesive layer 520 of FIG. 2 and FIG. 3, which include the same material, and thus, the adhesive layer 500 may be implemented as a single layer as shown in FIG. 4.

At least one of the first auxiliary layer 420 and the second auxiliary layer 430 may include the ultraviolet absorber described above. Detailed descriptions of the ultraviolet absorber will be omitted to avoid redundancy.

In this manner, even if ultraviolet rays are irradiated toward the display panel 100 to cure the adhesive layer 500, the display device according to an exemplary embodiment may absorb the ultraviolet rays due to the ultraviolet absorber included in at least one of the first auxiliary layer 420 and the second auxiliary layer 430. Thus, it is possible to prevent the ultraviolet rays from being incident on the display panel 100.

Referring to FIG. 5, the display panel 100 according to an exemplary embodiment may be a flat display panel 100. In this case, unlike the display device shown in FIG. 4, it is possible to include the screen print layer 411 without including the bonding layer 320 and the passivation film 330. Since other constituent elements of FIG. 5 are substantially the same as those described above, detailed descriptions thereof will be omitted to avoid redundancy.

Figure 6:
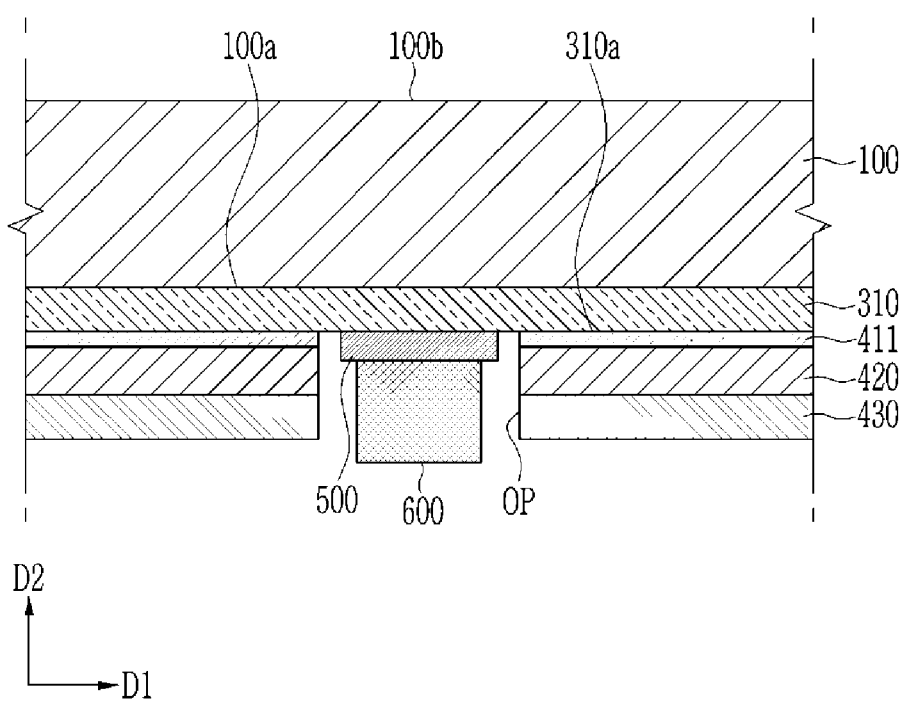
FIG. 6 is a schematic cross-sectional view of a display device according to an exemplary embodiment.
Figure 7:
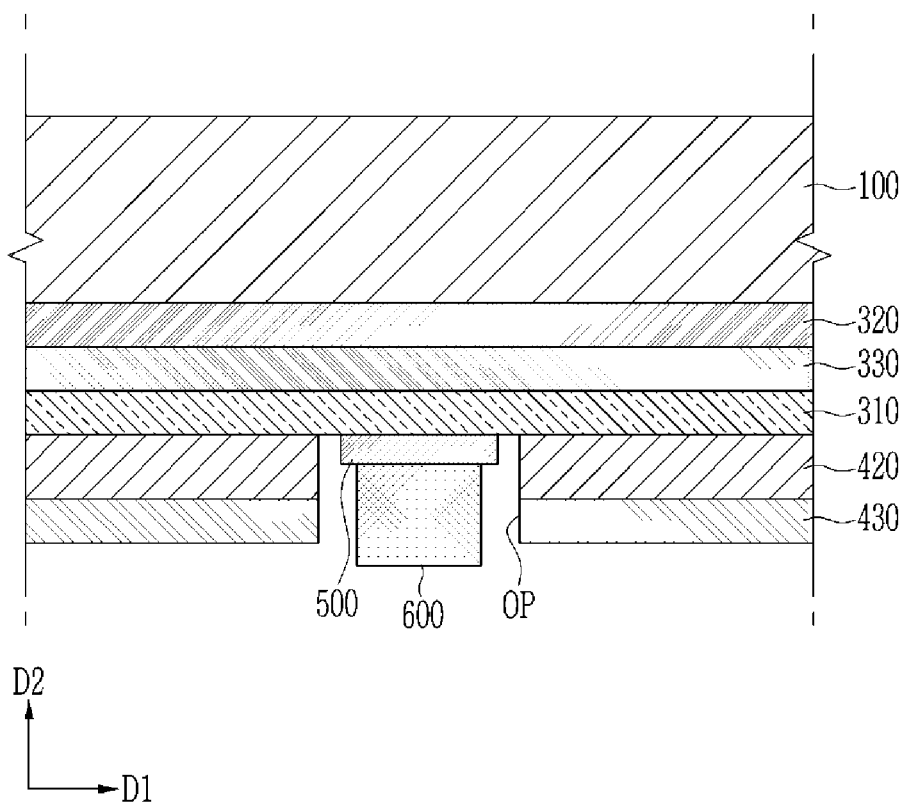
FIG. 7 is a schematic cross-sectional view of a display device according to an exemplary embodiment.

Hereinafter, a display device according to exemplary embodiments will be described with reference to FIG. 6 and FIG. 7. FIG. 6 and FIG. 7 are schematic cross-sectional views of a display device according to exemplary embodiments. Detailed descriptions of the constituent elements already described above will be omitted to avoid redundancy.

Referring to FIG. 6, the display device according to an exemplary embodiment includes the display panel 100 emitting light in the D2 direction, an ultraviolet absorbing film 310 disposed on the back surface 100a of the display panel 100, the screen print layer 411, the auxiliary layers 420 and 430, and the sensor 600 disposed on a back surface 310a of the ultraviolet absorbing film 310.

The display panel 100 according to the illustrated exemplary embodiment may be substantially flat.

The ultraviolet absorbing film 310 may completely overlap a front surface 100b of the display panel 100. The ultraviolet absorbing film 310 may include an ultraviolet absorber capable of absorbing ultraviolet rays having a wavelength of about 200 nm to about 400 nm.

The ultraviolet absorber may include at least one of a benzophenone-based compound, a benzotriazole-based compound, a benzoate-based compound, a cyanoacrylate-based compound, a triazine-based compound, an oxanilide-based compound, and a salicyate-based compound.

The benzophenone-based compound may include at least one of 2,4-dihydroxybenzophenone, 2-hydroxy-4-methoxybenzophenone, 2-hydroxy-4-octylbenzophenone, 4-dodecyloxy-2-hydroxybenzophenone, 4-benzyloxy-2-hydroxybenzophenone, 2,2",4,4"-tetrahydroxybenzophenone, and 2,2"-dihydroxy 4,4"-dimethoxybenzo, but the inventive concepts are not limited thereto.

The benzotriazole-based compound may include at least one of 2-(5-methyl-2-hydroxyphenyl) benzotriazole, 2-[2-hydroxy-3,5-bisα,αα-dimethylbenzyl) phenyl]-2H-benzo-triazole, 2-(3,5-di-t-butyl-2-hydroxyphenyl) benzotriazole, 2-(3-t-butyl-5-methyl-2-hydroxyphenyl)-5-chlorobenzotriazole, 2-(3-t-butyl-5-methyl-2-hydroxyphenyl)-5-chlorobenzotriazole, 2-(3,5-di-t-butyl-2-hydroxyphenyl)-5-chlorobenzotriazole, 2-(3,5-di-t-acyl-2-hydroxyphenyl) benzotriazole, and 2-(2"-hydroxy 5"-t-octylphenyl) benzotriazole, but the inventive concepts are not limited thereto.

The benzoate-based compound may include, 2,4-di-t-butylphenyl-3",5"-di-t-butyl-4-hydroxybenzoate, and the like, but the inventive concepts are not limited thereto.

The triazine-based compound may include 2-[4-[(2-hydroxy-3-dodecyloxypropyl) oxy]-2-hydroxyphenyl]-4,6-bis (2,4-dimethylphenyl) 1,3,5-triazine, but the inventive concepts are not limited thereto.

The salicylate-based compound may include at least one of phenyl salicylate and 4-t-butylphenyl salicylate, but the inventive concepts are not limited thereto.

Chemical formulae of the benzophenone-based compound and the benzotriazole-based compound among the ultraviolet absorbers are as follows.

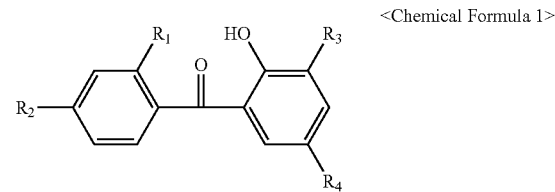

<Chemical Formula 1>

In Chemical Formula 1, $R_1$ may be one of hydrogen (H), an alkyl group, and a hydroxyl group, $R_2$ may be one of hydrogen (H), an alkyl group, and a phenyl group, $R_3$ may be one of hydrogen (H) and an alkyl group, and $R_4$ may be one of hydrogen (H) and an alkoxy group.

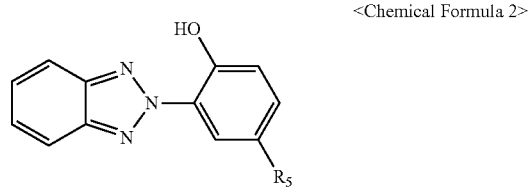

<Chemical Formula 2>

In Chemical Formula 2, $R_5$ may be one of hydrogen (H) and an alkyl group.

The adhesive layer 500 and the sensor 600 according to an exemplary embodiment may be formed in but not contact the lateral sides of the opening OP of the first auxiliary layer 420 and the second auxiliary layer 430. The opening OP may completely overlap the display area, and the adhesive layer 500 and the sensor 600 may also completely overlap the display area.

The adhesive layer 500 may attach the sensor 600 to the ultraviolet absorbing film 310. The adhesive layer 500 may include substantially the same material as the adhesive layer 500 described above with reference to FIG. 1.

In order to attach the ultraviolet absorbing film 310 and the sensor 600, a photo-curing process may be performed on an adhesive material included in the adhesive layer 500. In the photo-curing process, ultraviolet rays may be irradiated toward the display device. When the ultraviolet rays are irradiated to the thin film transistor or the light emitting diode of the display panel 100, the thin film transistor and the light emitting diode may be damaged. However, since the display device according to an exemplary embodiment includes the ultraviolet absorbing film 310, it is possible to improve reliability of the display panel 100 by blocking ultraviolet rays from being directed toward the display panel 100.

Referring to FIG. 7, the display device according to an exemplary embodiment further includes the bonding layer 320 and the passivation film 330 disposed between the display panel 100 and the ultraviolet absorbing film 310.

The display panel 100 according to an exemplary embodiment may be a flexible panel. For example, the display panel 100 may be flexible, stretchable, foldable, bendable, or rollable.

Since other constituent elements in FIG. 7 are substantially the same as those of FIG. 6, detailed descriptions thereof will be omitted to avoid redundancy.

Figure 8:
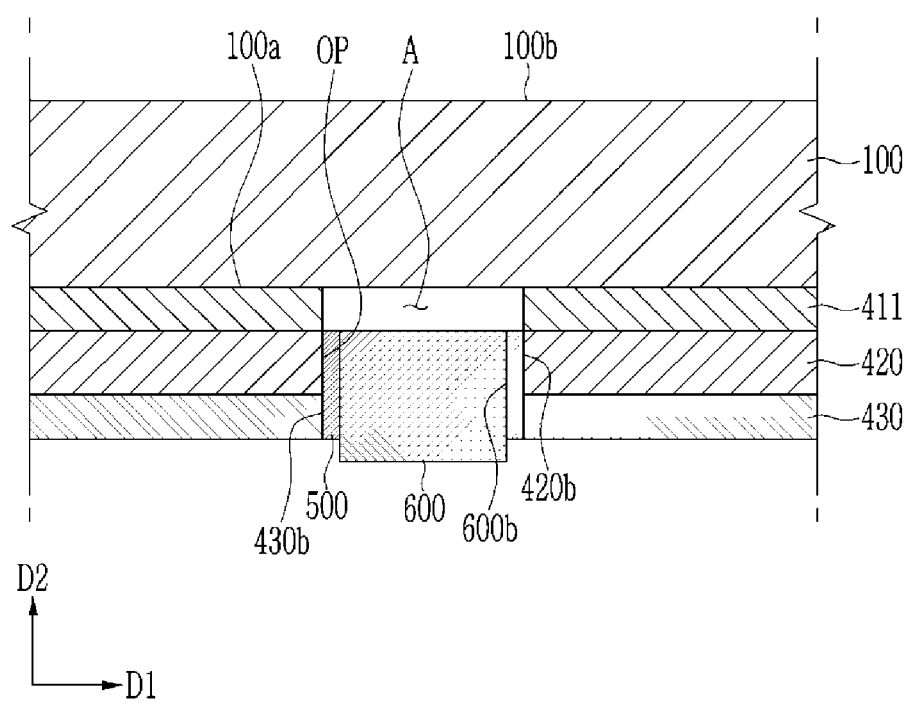
FIG. 8 is a schematic cross-sectional view of a display device according to an exemplary embodiment.
Figure 9:
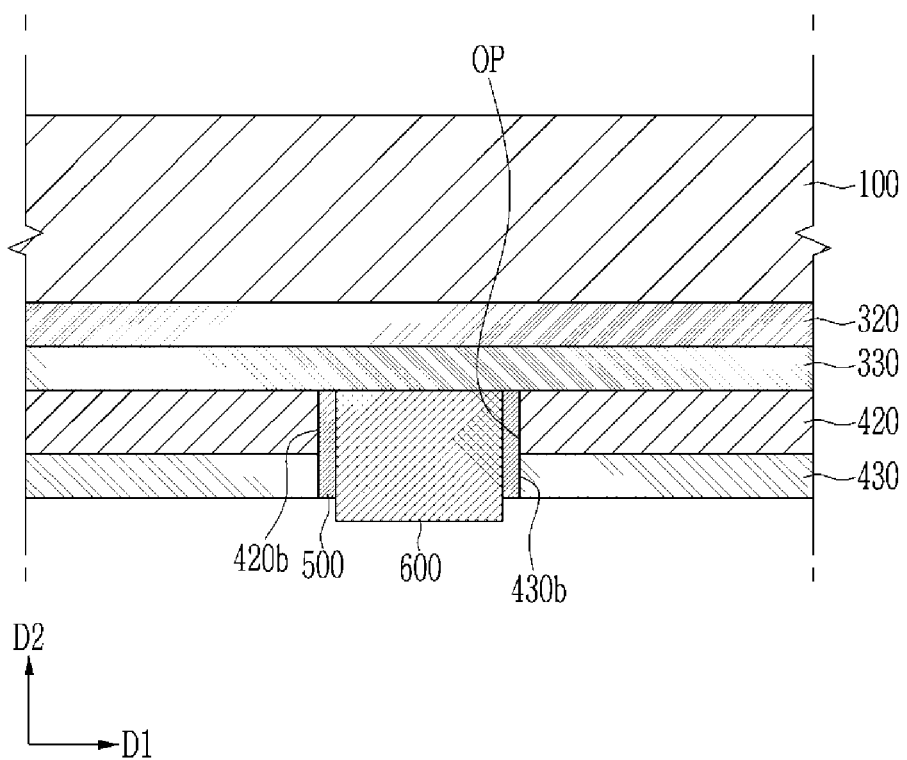
FIG. 9 is a schematic cross-sectional view of a display device according to an exemplary embodiment.

Hereinafter, a display device according to exemplary embodiments will be described with reference to FIG. 8 and FIG. 9. FIG. 8 and FIG. 9 are schematic cross-sectional views of a display device according to exemplary embodiments.

Referring to FIG. 8, the display device according to an exemplary embodiment includes the display panel 100 emitting light from top surface 100b in the D2 direction, the screen print layer 411 disposed on the back surface 100a of the display panel 100, the auxiliary layers 420 and 430, and the sensor 600. The display panel 100 according to the exemplary embodiment may be substantially flat.

The screen print layer 411, the first auxiliary layer 420, and the second auxiliary layer 430 may be provided with the opening OP of substantially the same size. The sensor 600 may be inserted into the opening OP. The opening OP may completely overlap the display area, and the sensor 600 inserted into the opening OP also may completely overlap the display area.

The sensor 600 may be attached to the display panel 100 due to the adhesive layer 500, which may attach a lateral surface 600b of the sensor 600 to a lateral surface 420b of the first auxiliary layer 420, and to a lateral surface 430b of the second auxiliary layer 430. The adhesive layer 500 according to an exemplary embodiment may be a double-sided adhesive tape. The adhesive layer 500 in the form of a double-sided adhesive tape may attach a portion of lateral surface 600b of the sensor 600 to opposed lateral surface 420b of the first auxiliary layer 420, or attach a portion of lateral surface 600b of the sensor 600 to lateral surface 430b of the second auxiliary layer 430.

FIG. 8 shows that the adhesive layer 500 overlaps the lateral surfaces 420b, 430b of the first and second auxiliary layers 420 and 430, but the inventive concepts are not limited thereto. For example, the adhesive layer 500 may overlap at least one of the screen print layer 411, the first auxiliary layer 420, and the second auxiliary layer 430. The area of the adhesive layer 500 may be varied according to the area of the sensor 600 overlapping the screen print layer 411, the first auxiliary layer 420, and the second auxiliary layer 430.

The sensor 600 according to an exemplary embodiment may overlap the first auxiliary layer 420 and the second auxiliary layer 430 in the D1 direction, but may not overlap the screen print layer 411 in the D1 direction. Accordingly, a space (A) may be formed between the sensor 600 and the display panel 100 by a thickness of the screen print layer 411.

However, the inventive concepts are not limited thereto, and when the sensor 600 overlaps the screen print layer 411 in D1 direction, the adhesive layer 500 may overlap the screen print layer 411 in D1 direction, and an open space A may not be formed.

Referring to FIG. 9, a display device according to an exemplary embodiment includes the display panel 100 emitting light in the D2 direction, the bonding layer 320 and the passivation film 330 disposed on the back surface 100a of the display panel 100, and the first auxiliary layer 420 and the second auxiliary layer 430 disposed on a back surface 330a of the passivation film 330.

The display panel 100 according to an exemplary embodiment may be a flexible panel. For example, the display panel 100 may be flexible, stretchable, foldable, bendable, or rollable.

The bonding layer 320 and the passivation film 330 disposed between the display panel 100 and the auxiliary layers 420 and 430 may protect the flexible display panel 100. The bonding layer 320 and the passivation film 330 are substantially the same as those already described above, and thus, detailed descriptions thereof will be omitted to avoid redundancy.

The first auxiliary layer 420 and the second auxiliary layer 430 may be provided with the opening OP of substantially the same size. The sensor 600 may be inserted into the opening OP. The opening OP may completely overlap the display area, and the sensor 600 overlapping the opening OP may also completely overlap the display area.

The sensor 600 and the auxiliary layers 420 and 430 may be attached due to the adhesive layer 500, which may attach a lateral surface 600b of the sensor 600 and lateral surfaces 420b, 430b of the first and second auxiliary layers 410 and 420. The adhesive layer 500 according to an exemplary embodiment may be a double-sided adhesive tape.

FIG. 9 shows that the adhesive layer 500 completely overlaps the lateral surfaces 420b, 430b of the first and second auxiliary layers 420 and 430, but the inventive concepts are not limited thereto, For example, the adhesive layer 500 may overlap less than the lateral surfaces of both auxiliary layers, such as only one of the first auxiliary layer 420 and the second auxiliary layer 430. The area of the adhesive layer 500 may be varied according to the area of the sensor 600 overlapping the first auxiliary layer 420 and the second auxiliary layer 430.

The adhesive layer 500 and the sensor 600 according to an exemplary embodiment may contact the passivation film 330. An open space may not be formed between the adhesive layer 500 and the passivation film 330, and between the sensor 600 and the passivation film 330.

A display device according to exemplary embodiments may include a sensor disposed in the display area. During manufacture, ultraviolet rays may be irradiated toward the display panel in the process of bonding the sensor to the display panel. When the ultraviolet rays are incident on the display panel, physical properties of the thin film transistor or the light emitting diode may be degraded, which may deteriorate the reliability of the display device. A display device constructed according to the principles of the invention may include an auxiliary layer including an ultraviolet absorber, which may absorb the ultraviolet rays incident on the display panel, or an ultraviolet absorbing film to absorb the ultraviolet rays incident in the direction of the display panel, thereby maintaining the reliability of the display device. In addition, according to exemplary embodiments, it is possible to integrate the sensor with the display panel without a UV irradiation process by using the double-sided adhesive tape or the like, rather than a photocurable adhesive layer.

Some of the advantages that may be achieved by exemplary embodiments of the invention include positioning a sensor to overlap a display area of a display panel. In addition, even if the sensor is attached to the display area, it is possible to prevent occurrence of a stain caused by an adhesive layer. Further, it is possible to improve reliability of the display panel by preventing ultraviolet rays irradiated in a manufacturing process of a display device from being incident on the display panel.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel having a first side including a display area configured to emit light and a second side opposite to the first side;
    a sensor having a first surface facing the display panel;
    a first adhesive layer disposed between the first surface of the sensor and the display panel; and
    a second adhesive layer disposed on a side surface of the sensor,
    wherein the second adhesive layer and the first adhesive layer contact each other.

2. The display device of claim 1, wherein the first adhesive layer and the second adhesive layer comprise the same material.

3. The display device of claim 1, wherein the first adhesive layer and the second adhesive layer comprise different materials.

4. The display device of claim 1, further comprising an auxiliary layer disposed on the second side of the display area and including an opening.

5. The display device of claim 4, wherein the auxiliary layer comprises an ultraviolet absorber.

6. The display device of claim 5, wherein the ultraviolet absorber comprises at least one of a benzophenone-based compound, a benzotriazole-based compound, a benzoate-based compound, a cyanoacrylate-based compound, a triazine-based compound, an oxanilide-based compound, and a salicylate-based compound.

7. The display device of claim 1, wherein the sensor comprises at least one of a fingerprint recognition sensor and an infrared ray detection sensor.

8. The display device of claim 1, further comprising a screen print layer disposed on the second side of the display panel.

9. The display device of claim 1, wherein the display panel is flexible.

10. The display device of claim 1, further comprising:
    a passivation film disposed between the display panel and the sensor; and
    a third adhesive layer disposed between the passivation film and the display panel.

11. The display device of claim 10, wherein the third adhesive layer comprises a conductive polymer.

12. The display device of claim 4, wherein the auxiliary layer includes a polymer resin.

13. The display device of claim 12, wherein the polymer resin includes at least one of polyurethane, polycarbonate, polypropylene, polyethylene, and polyethyleneterephthalate.

14. The display device of claim 4, wherein the auxiliary layer includes at least one of a rubber liquid, a urethane-based material, and a sponge foamed with an acrylic material.

15. The display device of claim 14, wherein the auxiliary layer includes metal.

16. The display device of claim 15, wherein the metal comprises aluminum or steel use stainless (SUS).

17. The display device of claim 1, wherein at least one of the first and second adhesive layers comprises at least one of an optical clear adhesive (OCA), an optical clear resin (OCR), an acrylic adhesive, a silicone adhesive, and a urethane adhesive.

18. A display device comprising:
    a display panel having a display area with a first surface extending in a first direction;
    a sensor having a side surface extending in a second direction intersecting the first direction; and
    an adhesive layer,
    wherein the sensor is coupled to the display panel only by the adhesive layer.

19. The display device of claim 18, wherein the sensor comprises at least one of a fingerprint recognition sensor and an infrared ray detection sensor.

20. The display device of claim 18, further comprising an auxiliary layer disposed on the display area and having a side surface extending in the second direction, the auxiliary layer including an opening.

21. The display device of claim 20, wherein the auxiliary layer includes a polymer resin or metal.

22. The display device of claim 20, wherein the auxiliary layer includes at least one of a rubber liquid, a urethane-based material, and a sponge foamed with an acrylic material.

* * * * *